US012664950B2

(12) United States Patent
Choi et al.

(10) Patent No.: US 12,664,950 B2
(45) Date of Patent: Jun. 23, 2026

(54) DISPLAY DEVICE

(71) Applicant: LG DISPLAY CO., LTD., Seoul (KR)

(72) Inventors: Seong-Wook Choi, Paju-si (KR);
Jin-Uk Lee, Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 0 days.

(21) Appl. No.: 19/036,444

(22) Filed: Jan. 24, 2025

(65) Prior Publication Data

US 2025/0166578 A1 May 22, 2025

Related U.S. Application Data

(63) Continuation of application No. 18/436,568, filed on
Feb. 8, 2024, now Pat. No. 12,243,494, which is a
continuation of application No. 18/190,470, filed on
Mar. 27, 2023, now Pat. No. 11,935,491, which is a
continuation of application No. 17/553,062, filed on
Dec. 16, 2021, now Pat. No. 11,640,798.

(30) Foreign Application Priority Data

Dec. 24, 2020 (KR) ........................ 10-2020-0183600

(51) Int. Cl.
*G09G 3/3291* (2016.01)
*G09G 3/3266* (2016.01)
*H10K 59/131* (2023.01)
*H10K 59/40* (2023.01)

(52) U.S. Cl.
CPC ......... *G09G 3/3291* (2013.01); *G09G 3/3266*
(2013.01); *H10K 59/131* (2023.02); *H10K*
*59/40* (2023.02); *G09G 2310/0297* (2013.01);
*G09G 2330/028* (2013.01)

(58) Field of Classification Search
CPC .. G09G 3/3291; G09G 3/3266; G09G 3/3233;
G09G 3/3258; H10K 59/131; H10K
59/40
See application file for complete search history.

(56) References Cited

U.S. PATENT DOCUMENTS

| | | | | | |
|---|---|---|---|---|---|
| 10,665,169 | B2 * | 5/2020 | Chang | .................. | G09G 3/3266 |
| 10,734,458 | B2 * | 8/2020 | Kang | ................... | G06F 3/0412 |
| 10,735,629 | B2 * | 8/2020 | Son | ...................... | G09G 3/3266 |
| 11,177,338 | B2 * | 11/2021 | Kim | ..................... | H10K 59/131 |
| 11,211,020 | B2 * | 12/2021 | Ono | ...................... | G09G 3/3291 |
| 11,355,059 | B2 * | 6/2022 | Song | ..................... | G09G 3/3233 |
| 2007/0146245 | A1 * | 6/2007 | Goden | .................. | G09G 3/325 |
| | | | | | 345/76 |
| 2018/0005569 | A1 * | 1/2018 | Li | ......................... | G09G 3/3233 |

* cited by examiner

*Primary Examiner* — Sardis F Azongha

(74) *Attorney, Agent, or Firm* — Fish & Richardson P.C.

(57) ABSTRACT

A display device comprises a display panel including a
plurality of sub-pixels defined by a plurality of gate lines and
a plurality of data lines; and an auxiliary ground voltage line
disposed between two adjacent data lines of the plurality of
data lines.

23 Claims, 8 Drawing Sheets

<u>SP</u> lower end part

FIG. 6

DISPLAY DEVICE

CROSS-REFERENCE TO RELATED APPLICATIONS

The present application is a continuation of U.S. patent application Ser. No. 18/436,568, filed on Feb. 8, 2024, which is a continuation of U.S. patent application Ser. No. 18/190, 470, filed on Mar. 27, 2023, now U.S. Pat. No. 11,935,491, which is a continuation of U.S. patent application Ser. No. 17/553,062, filed on Dec. 16, 2021, now U.S. Pat. No. 11,640,798, issued on May 2, 2023, which claims the priority of Korean Patent Application No. 10-2020-0183600, filed on Dec. 24, 2020, which are hereby incorporated by reference in their entirety for all purposes as if fully set forth herein.

BACKGROUND

Field of the Disclosure

The present disclosure relates to a display device, and more particularly, to a display device with a demultiplexer for reducing the number of channels of a data driving portion in which the coupling between data lines may be prevented.

Description of the Background

Recently, an organic light emitting display device, which has been in the spotlight as a display device, has advantages of a fast response speed, high luminous efficiency, high luminance, and wide viewing angles by using an organic light emitting diode (OLED).

In the organic light emitting display device, pixels including organic light emitting diodes are arranged in a matrix form, and brightness of the pixels selected by a scan signal are controlled according to a gray level of a data.

In addition to the organic light emitting diode, each pixel of the organic light emitting display device includes a gate line and a data line crossing each other, a thin film transistor connected to the gate line and the data line, a storage capacitor, and the like.

Here, each pixel may further include transistors for performing various functions. As a result, the number of signal lines for supplying various signals to the transistors increases, so that the pixel structure may be complicated.

Accordingly, a demultiplexer (DEMUX) may be disposed between the data driving portion and the data lines. The demultiplexer connects one channel of the data driving portion and several data lines and sequentially distributes the data voltages output from one channel to the several data lines, so that the number of channels of the data driving portion may be reduced.

However, although the number of channels of the data driving portion may be reduced by using the demultiplexer, a voltage difference between the data lines occurs because the data voltages are sequentially applied to two adjacent data lines.

When there is a voltage difference between two adjacent data lines, the electrical interference between the data lines, that is, a coupling phenomenon may occur, which may cause a large difference in luminance between adjacent pixels.

SUMMARY

Accordingly, the present disclosure is directed to an organic light emitting display device that substantially obviates one or more of the problems due to limitations and disadvantages described above.

More specifically, the present disclosure is to provide an organic light emitting display device that prevents a coupling phenomenon between adjacent data lines.

The present disclosure is also to provide an organic light emitting display device that prevents a low potential power supply voltage VSS from increasing.

Further, the present disclosure is to provide an organic light emitting display device that has a narrow bezel.

Additional features and aspects will be set forth in the description that follows, and in part will be apparent from the description, or may be learned by practice of the present disclosure provided herein. Other features and aspects of the inventive concepts may be realized and attained by the structure particularly pointed out in the written description, or derivable therefrom, and the claims hereof as well as the appended drawings.

To achieve these and other aspects of the present disclosure, as embodied and broadly described herein, a display device comprises a display panel including a plurality of sub-pixels defined by a plurality of gate lines and a plurality of data lines; and an auxiliary ground voltage line disposed between two adjacent data lines of the plurality of data lines.

In another aspect, a display device comprises a display panel including a plurality of sub-pixels, a plurality of gate lines, a plurality of data lines, and a plurality of common voltage lines; and a shielding line disposed between the data line and the common voltage line adjacent to each other.

In another aspect, a display device comprises a display panel including a plurality of gate lines, a plurality of data lines and a plurality of sub-pixels; a scan driving portion applying scan signals to the gate lines; a data driving portion applying data signals to the data lines; a MUX driving portion selectively connecting the data lines to channels of the data driving portion; an auxiliary ground voltage line disposed between two adjacent data lines of the plurality of data lines, and supplied with a low potential power supply voltage.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings:

FIG. 6 is a view schematically illustrating a part of an organic light emitting display device according to a second aspect of the present disclosure.

DETAILED DESCRIPTION

Reference will now be made in detail to aspects of the disclosure, examples of which are illustrated in the accompanying drawings.

Figure 1:
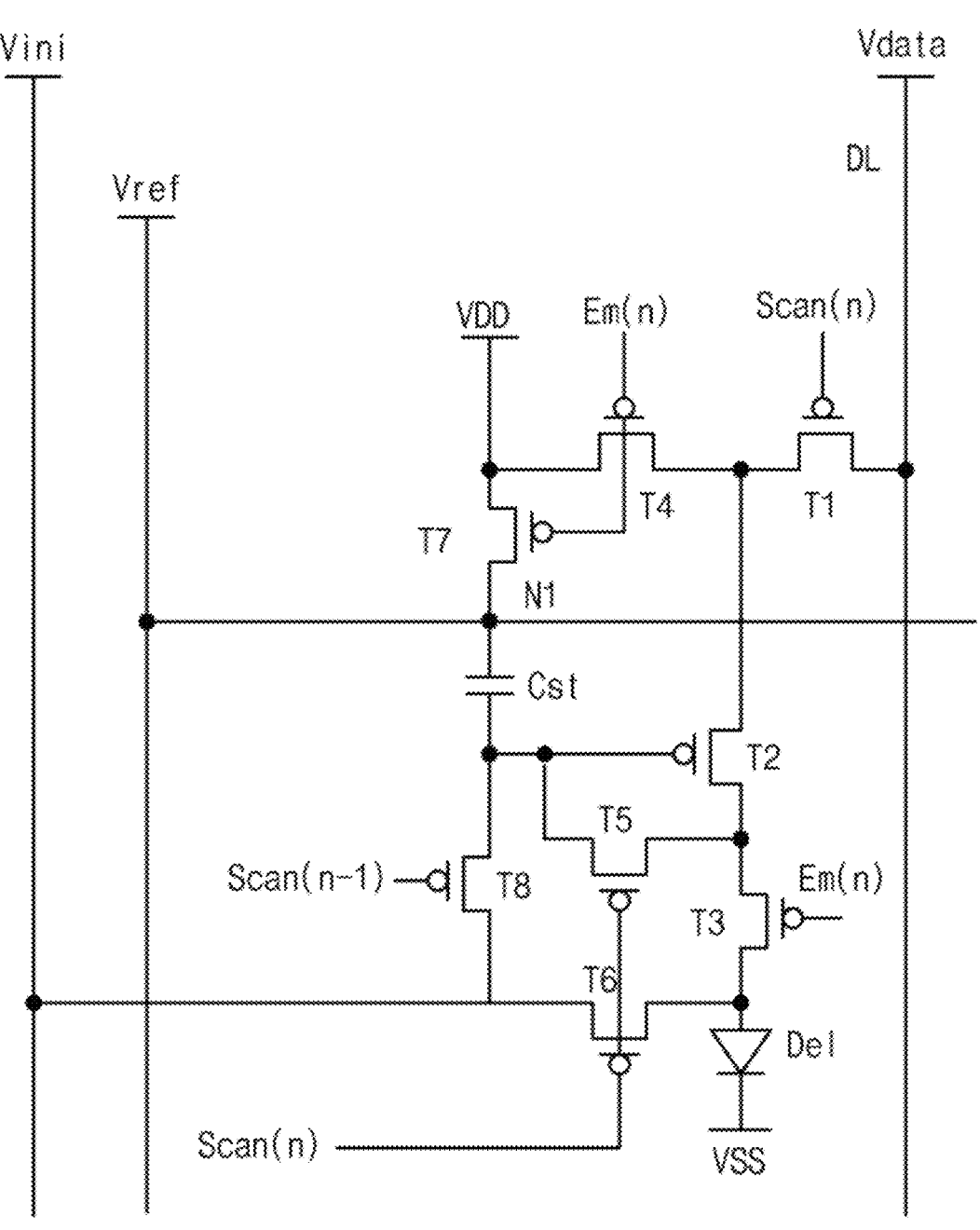
FIG. 1 is an equivalent circuit diagram of a pixel structure of an organic light emitting display device according to a first aspect of the present disclosure.

FIG. 1 is an equivalent circuit diagram of a pixel structure of an organic light emitting display device according to a first aspect of the present disclosure.

In FIG. 1, each sub-pixel SP of the organic light emitting display device according to the first aspect of the present disclosure includes first, second, third, fourth, fifth, sixth, seventh, and eighth transistors T1, T2, T3, T4, T5, T6, T7, and T8, a storage capacitor Cst, and a light emitting diode Del. The circuit configuration of the transistors is not limited to FIG. 1.

For example, the organic light emitting display device may have a 6T1C structure, 10T2C structure, or the like. The first, second, third, fourth, fifth, sixth, seventh, and eighth transistors T1, T2, T3, T4, T5, T6, T7, and T8 may be P-type transistors.

The first transistor T1, which is a switching transistor, is switched according to an nth gate voltage Scan(n) to transmit a data voltage Vdata. The gate electrode of the first transistor T1 receives the nth gate voltage Scan(n) of an nth gate line. The source electrode of the first transistor T1 is connected to a data line DL. The drain electrode of the first transistor T1 is connected to the source electrodes of the second and fourth transistors T2 and T4.

The second transistor T2, which is a driving transistor, is switched according to a voltage of the first electrode of the storage capacitor Cst. The gate electrode of the second transistor T2 is connected to the first electrode of storage capacitor Cst, the drain electrode of the fifth transistor T5, and the source electrode of the eighth transistor T8. The drain electrode of the second transistor T2 is connected to the source electrodes of the third and fifth transistors T3 and T5.

The third transistor T3 is switched according to an nth emission voltage Em(n). The gate electrode of the third transistor T3 receives the nth emission voltage Em(n). The source electrode of the third transistor T3 is connected to the drain electrode of the second transistor T2 and the source electrode of the fifth transistor T5. The drain electrode of the third transistor T3 is connected to the source electrode of the sixth transistor T6 and the anode of the light emitting diode Del.

The fourth transistor T4 is switched according to the nth emission voltage Em(n). The gate electrode of the fourth transistor T4 receives the nth emission voltage Em(n). The source electrode of the fourth transistor T4 is connected to the drain electrode of the first transistor T1 and the source electrode of the second transistor T2. The drain electrode of the fourth transistor T4 receives the high potential power supply voltage VDD and is connected to the source electrode of the seventh transistor T7.

The fifth transistor T5 is switched according to the nth gate voltage Scan(n). The gate electrode of the fifth transistor T5 receives the nth gate voltage Scan(n). The source electrode of the fifth transistor T5 is connected to the drain electrode of the second transistor T2 and the source electrode of the third transistor T3. The drain electrode of the fifth transistor T5 is connected to the gate electrode of the second transistor T2, the first electrode of the storage capacitor Cst, and the source electrode of the eighth transistor T8.

The sixth transistor T6 is switched according to the nth gate voltage Scan(n). The gate electrode of the sixth transistor T6 receives the nth gate voltage Scan(n). The source electrode of the sixth transistor T6 is connected to the drain electrode of the third transistor T3 and the anode of the light emitting diode Del. The drain electrode of the sixth transistor T6 receives the initialization voltage Vini and is connected to the drain electrode of the eighth transistor T8.

The seventh transistor T7 is switched according to the nth emission voltage Em(n). The gate electrode of the seventh transistor T7 receives the nth emission voltage Em(n). The source electrode of the seventh transistor T7 receives the high potential power supply voltage VDD. The drain electrode of the seventh transistor T7 receives the reference voltage Vref and is connected to the second electrode of the storage capacitor Cst.

The eighth transistor T8 is switched according to the (n−1)th gate voltage Scan(n−1). The gate electrode of the eighth transistor T8 receives the (n−1)th gate voltage Scan (n−1). The source electrode of the eighth transistor T8 is connected to the first electrode of the storage capacitor Cst, the gate electrode of the second transistor T2, and the drain electrode of the fifth transistor T5. The drain electrode of the eighth transistor T8 receives the initialization voltage Vini and is connected to the drain electrode of the sixth transistor T6.

The light emitting diode Del is connected between the third transistor T3 and the low potential power supply voltage VSS and emits light having a luminance proportional to the current of the second transistor T2.

In the sub-pixel SP, the light emitting diode Del emits light to display an image according to the operation of the first to eight transistors T1 to T8 and the storage capacitor Cst. By using the sub-pixel SP, the variation of the threshold voltage and degradation of the light emitting diode Del due to the hours of use may be compensated, and the light emitting diode Del is driven according to the duty ratio corresponding to the emission time to thereby control the luminance.

Figure 2:
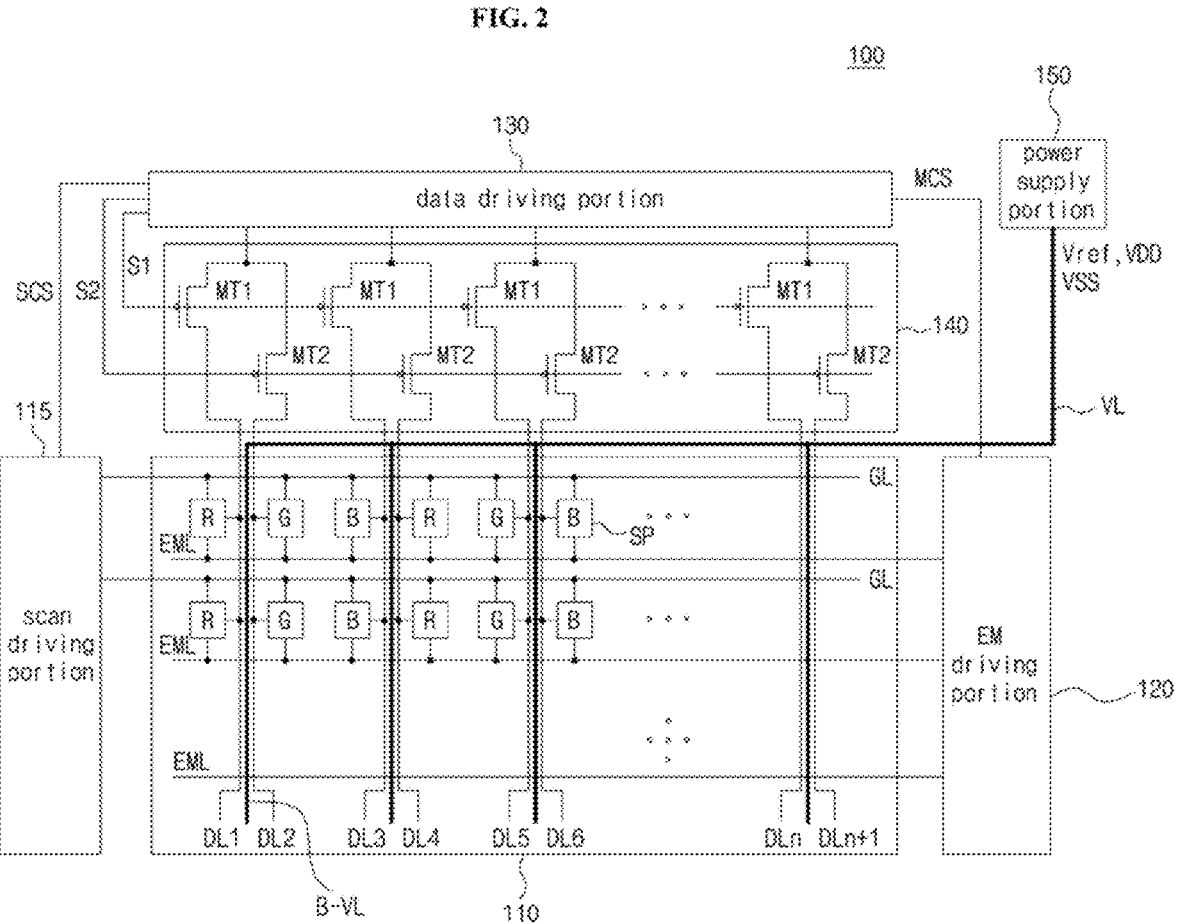
FIG. 2 is a schematic view showing the overall structure of the organic light emitting display device according to the first aspect of the present disclosure.

FIG. 2 is a schematic view showing the overall structure of the organic light emitting display device according to the first aspect of the present disclosure.

In FIG. 2, the organic light emitting display device 100 according to the first aspect of the present disclosure includes a display panel 110 where the sub-pixels SP are defined and a plurality of driving portions 115, 120, 130, 140, and 150 connected to the display panel 110.

The display panel 110 includes a plurality of gate lines GL and a plurality of data lines DLn and DLn+1 crossing each other on a substrate, and n is a natural number. The sub-pixels SP including red, green, and blue sub-pixels R, G, and B are defined by the crossing portions of the gate lines GL and the data lines DLn and DLn+1.

An emission (EM) signal line EML is parallel to the gate lines GL and is connected to each sub-pixel SP. Each sub-pixel SP is further connected to a plurality of signal lines providing the reference voltage Vref for the threshold voltage compensation and the high potential power supply voltage VDD and the low potential power supply voltage VSS for driving.

Particularly, each of the data lines DLn and DLn+1 is connected to the adjacent two sub-pixels R and G, B and G, or G and B horizontally, and the adjacent two data lines DLn and DLn+1 are connected to one channel through a MUX driving portion 140.

In addition, each sub-pixel SP of the display panel 110 is connected to the scan driving portion 115, the EM driving portion 120, and the data driving portion 130, which are formed in the periphery of the display panel 110. The scan driving portion 115 applies the scan signal to the gate lines GL, the EM driving portion 120 applies the EM signal to the EM signal lines EML, and the data driving portion 130 applies the data signal to the data lines DLn and DLn+1.

Here, the scan driving portion 115 and the EM driving portion 120 may be implemented as thin film transistors and mounted in the display panel 110.

The data driving portion 130 is not directly connected to the display panel 110 and is connected to the display panel 110 through the MUX driving portion 140, which includes a plurality of transistors MT1 and MT2 selectively connecting the data lines DLn and DLn+1 and the channel of the data driving portion.

Meanwhile, although not shown in the figure, the sub-pixel SP includes an organic light emitting diode Del of FIG. 1, a storage capacitor Cst of FIG. 1, a switching transistor T1 of FIG. 1, a driving transistor T2 of FIG. 1, and so on. Here, the organic light emitting diode Del of FIG. 1 may include an anode (hole injection electrode), an organic compound layer, and a cathode (electron injection layer).

The organic compound layer may further include various organic layers for efficiently transferring carriers of holes or electrons to a light emitting layer in addition to the light emitting layer in which light is actually emitted. The organic layers may be a hole injection layer and a hole transport layer interposed between the anode and the light emitting layer and an electron injection layer and an electron transport layer interposed between the cathode and the light emitting layer.

In addition, the switching transistor T1 of FIG. 1 is connected to the gate line GL and the data line DLn and DLn+1 and provides a data voltage input to the data line DLn and DLn+1 to the driving transistor T2 of FIG. 1 according to a switching voltage input to the gate line GL.

The storage capacitor Cst of FIG. 1 is connected to the switching transistor T1 of FIG. 1 and a power line PL (referring to FIG. 3) and storages a voltage proportional to the difference between the data voltage transmitted from the switching transistor T1 of FIG. 1 and a voltage removing the threshold voltage of the driving transistor T2 of FIG. 1 sampled through the reference voltage Vref.

Further, the driving transistor T2 of FIG. 1 is connected to the high potential power supply voltage VDD and the storage capacitor Cst of FIG. 1 and provides a drain current corresponding to the voltage between the gate electrode and the source electrode thereof to the organic light emitting diode Del of FIG. 1, so that the organic light emitting diode Del of FIG. 1 emits light due to the drain current.

The scan driving portion 115 and the EM driving portion 120 sequentially apply the scan signal Scan and the EM signal EM to each sub-pixel SP in units of one horizontal line, respectively. The scan driving portion 115 and the EM driving portion 120 may be implemented as shift registers having a plurality of stages and appropriately output the scan signal Scan and the EM signal EM of a high level or a low level according to an initialization period and a sampling period to correspond to the scan control signal SCS and the EM control signal MCS generated from a timing control circuit (not shown) built in the data driving portion 130.

Meanwhile, the data driving portion 130 receives an image data from the external system and converts it into the data voltage Vdata of an analog voltage type that may be processed by the sub-pixel SP and provides the data voltage Vdata to each sub-pixel SP through the data lines DLn and DLn+1 in synchronization with the driving timing of each sub-pixel SP. In addition, the timing control circuit included in the data driving portion 130 generates the above-described control signals using the timing signal input from the external system. Alternatively, the timing control circuit may be provided separately from the data driving portion 130.

In addition, although not shown in the figure, the data driving portion 130 includes a MUX control circuit (not shown), which generates MUX control signals S1 and S2 selectively turning on and off first and second MUX transistors MT1 and MT2 provided in the MUX driving portion 140 to be described later. Through this, two adjacent sub-pixels of the display panel 110 are alternately driven for one horizontal period 1H.

The above-described MUX control circuit (not shown) may be implemented as 1×2 Demultiplexer that outputs one enable voltage level so as not to overlap any one of the first control signal S1 and the second control signal S2.

The MUX driving portion 140 includes a plurality of groups of MUX transistors, and each group includes a first MUX transistor MT1 and a second MUX transistor MT2 that alternately connect two adjacent data lines DLn and DLn+1 of the display panel 110 to one channel of the data driving portion 130 according to the MUX control signals S1 and S2.

Here, the first MUX transistors MT1 are connected to odd-numbered data lines DL1, DL3, and DLn, and the second MUX transistors MT2 are connected to even-numbered data lines DL2, DL4, and DLn+1.

The MUX control signals S1 and S2 are signals of alternating enable levels, and the odd-numbered data lines DLn and the even-numbered data lines DLn+1 are alternately connected to one channel.

In addition, a plurality of signal lines supplying the reference voltage Vref, the high potential power supply voltage VDD, and the low potential power supply voltage VSS are connected to the power supply portion 150.

The power supply portion 150 may include a charge pump, a regulator, a buck converter, a boost converter, and the like.

The power supply portion 150 generates power sources required to drive the display panel 110 by adjusting DC input voltages from the host system. The power supply portion 150 may output DC power sources such as the gamma reference voltage GMA, the gate off voltage VGH, the gate on voltage VGL, a high potential power supply voltage VDD, the low potential power supply voltage VSS, the initialization voltage Vini, the reference voltage Vref, and the like. The gamma reference voltage GMA is supplied to the data driving portion 130, and the gate off voltage VGH and the gate on voltage VGL are supplied to the scan driving portion 115.

Here, in the organic light emitting display device 100 according to the first aspect of the present disclosure, the auxiliary ground voltage line B-VL is a part of the ground voltage line VL (referring to FIG. 4A) for supplying the low potential power supply voltage VSS or extends from the ground voltage line VL, and the auxiliary ground voltage line B-VL is disposed between two adjacent data lines DLn and DLn+1.

From this, while the number of channels of the data driving portion 130 is reduced by using the demultiplexer, the electrical interference between the two adjacent data lines DLn and DLn+1, that is, the coupling phenomenon may be prevented from occurring.

Accordingly, it is also possible to prevent a large difference in luminance between neighboring sub-pixels SP. This will be described in more detail with reference to FIG. 3.

Figure 3:
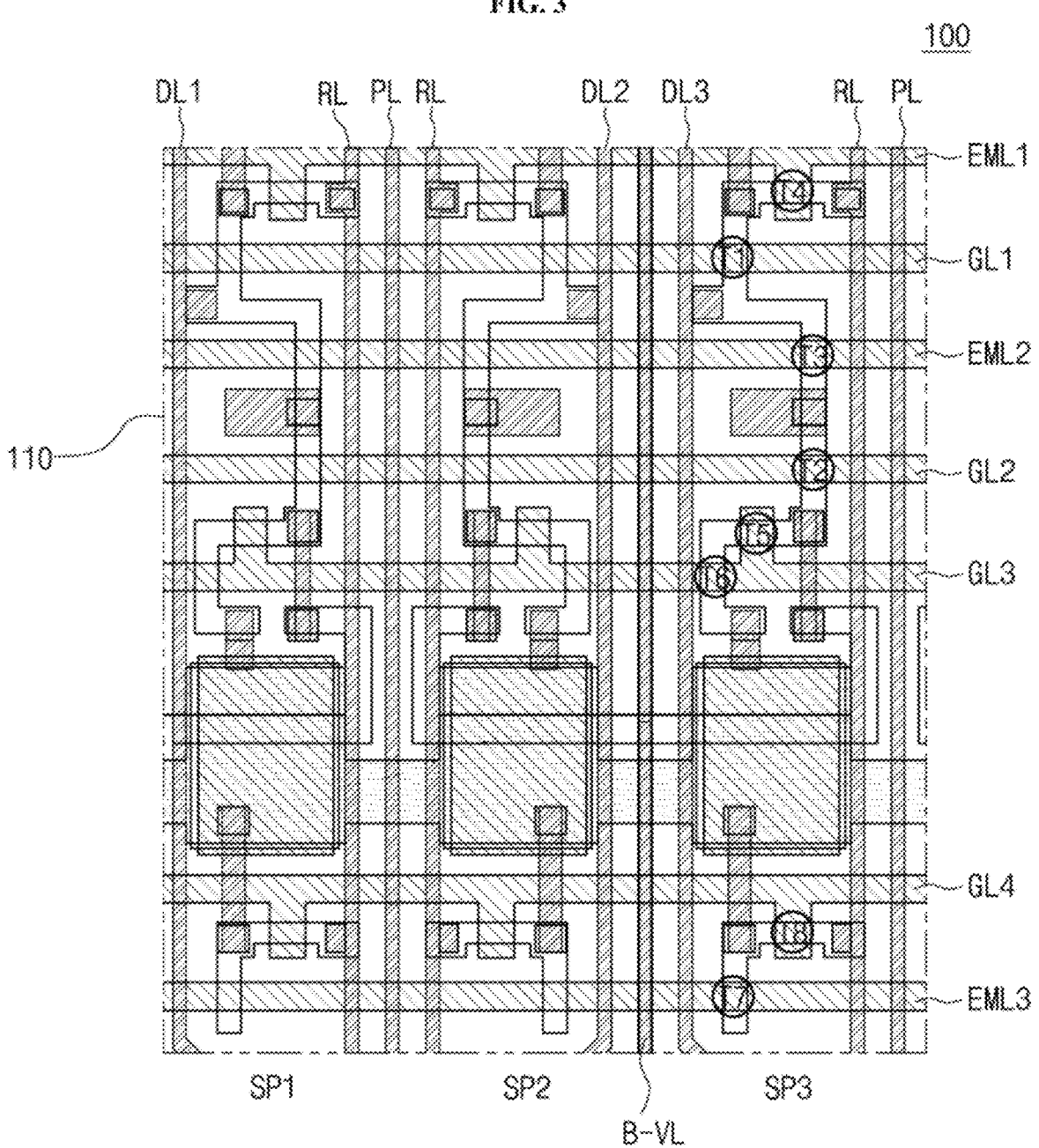
FIG. 3 is a plan view showing a pixel structure according to the first aspect of the present disclosure.
Figure 4A:
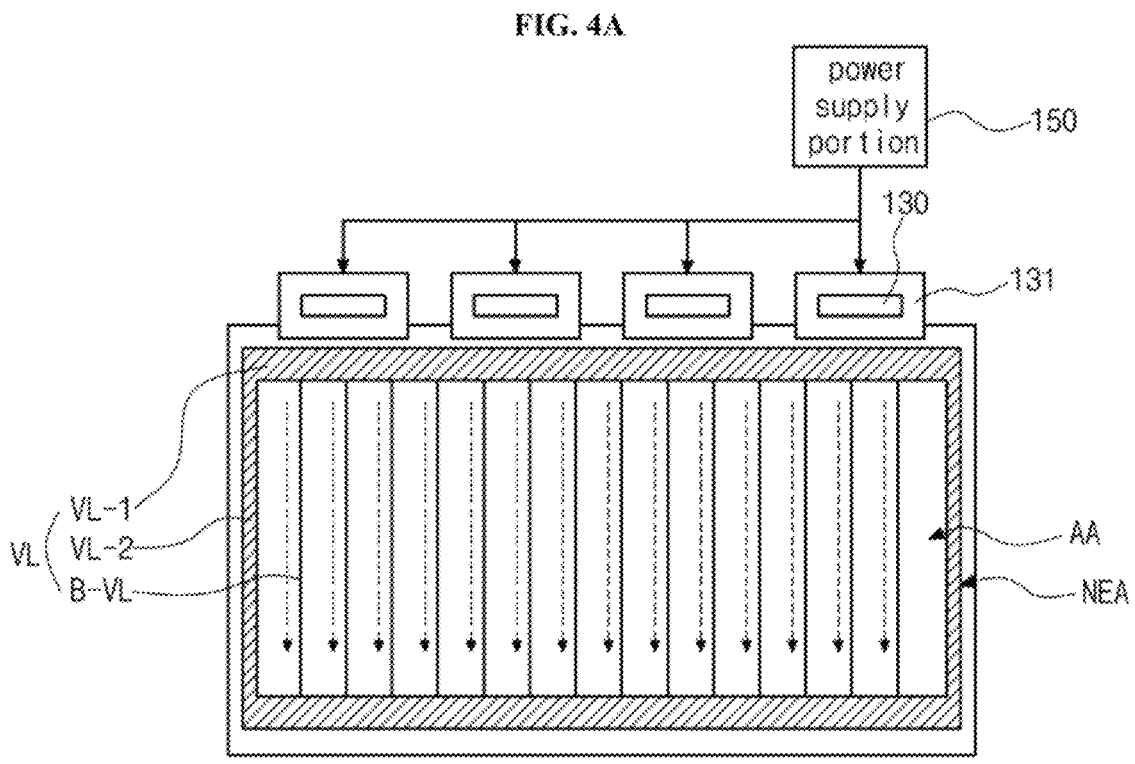
FIGS. 4A and 4B are plan views showing a planar structure of a ground voltage line.
Figure 4B:
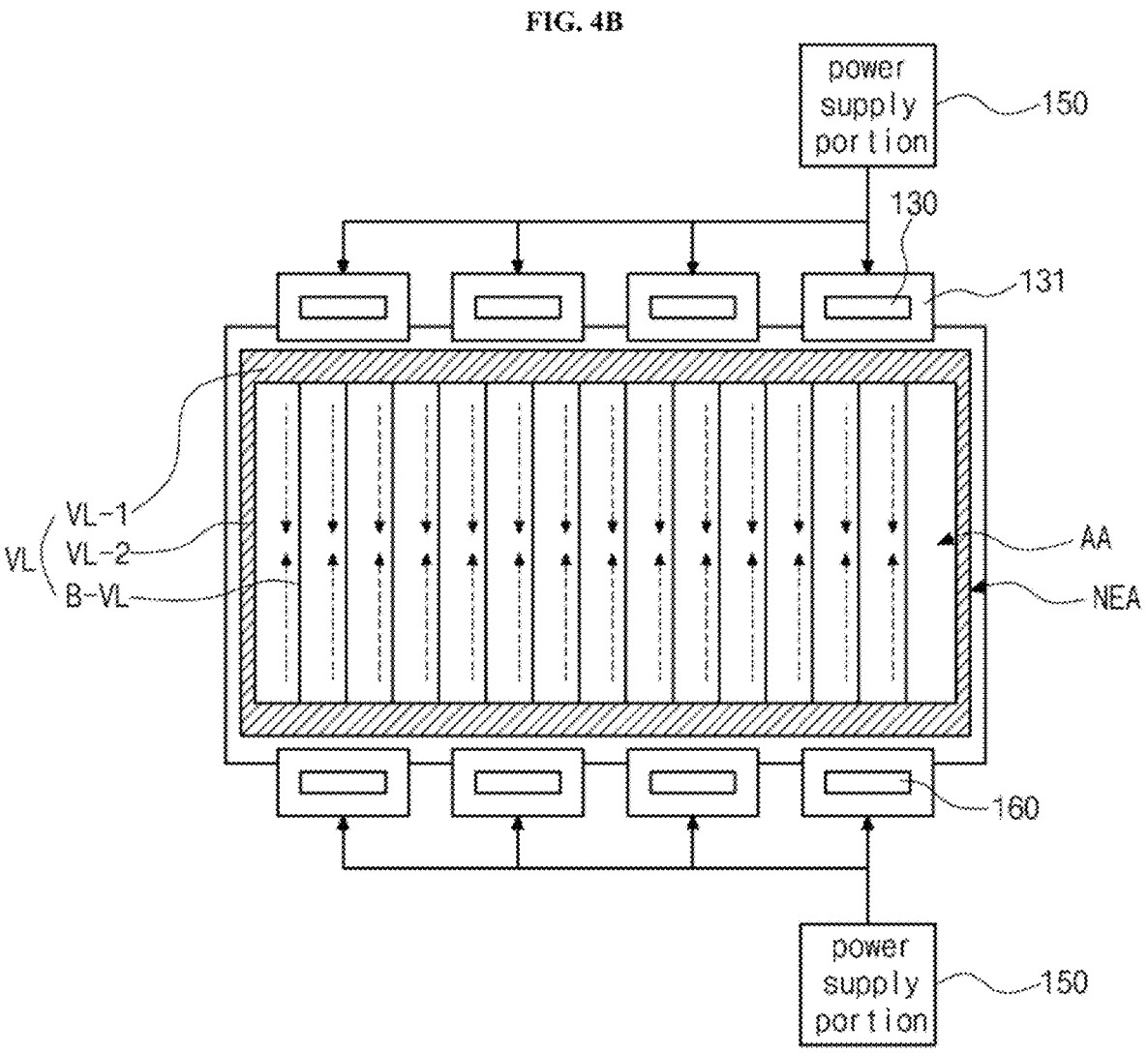

FIG. 3 is a plan view showing a pixel structure according to the first aspect of the present disclosure, and FIGS. 4A and 4B are plan views showing a planar structure of a ground voltage line.

Figure 5A:
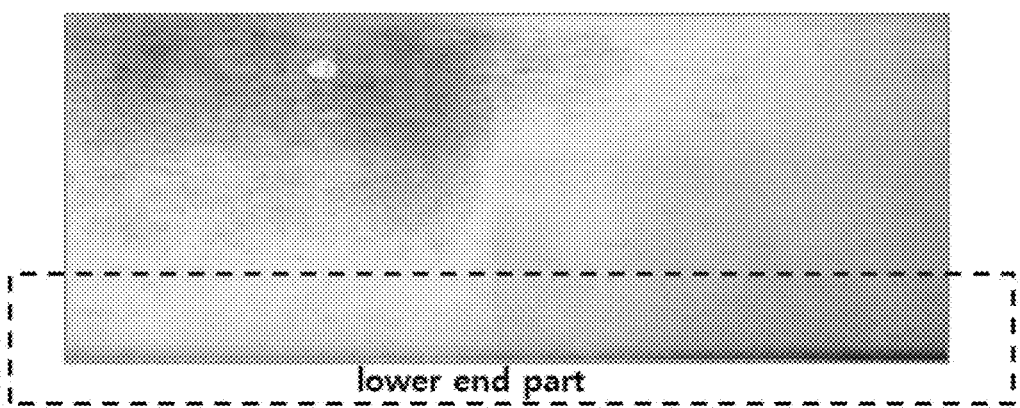
FIG. 5A is a simulation result showing occurrence of the phenomenon in which the low potential power supply voltage VSS becomes non-uniform.
Figure 5B:
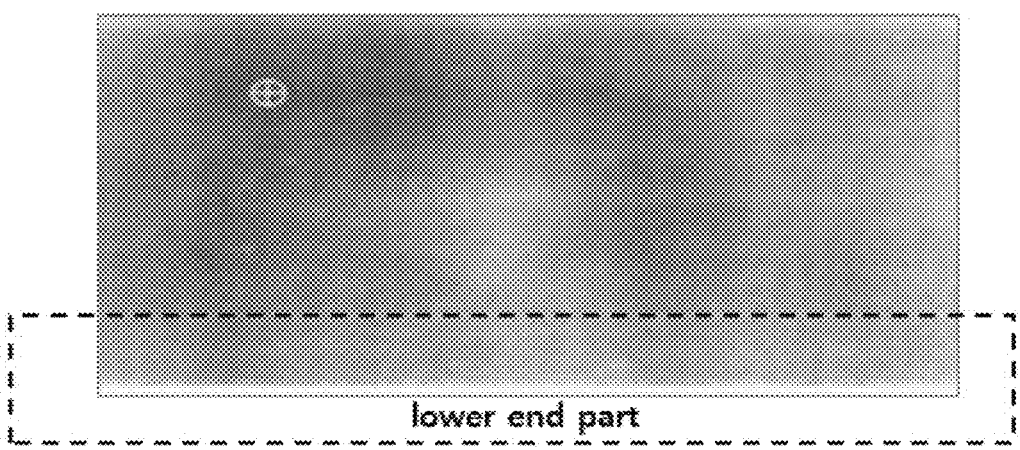
FIG. 5B is a simulation result of measuring the uniformity of the white luminance of the organic light emitting display device according to the first aspect of the present disclosure.

FIG. 5A is a simulation result showing occurrence of the phenomenon in which the low potential power supply voltage VSS becomes non-uniform, and FIG. 5B is a simulation result of measuring the uniformity of the white luminance of the organic light emitting display device according to the first aspect of the present disclosure.

As shown in FIG. 3, in the organic light emitting display device 100 according to the first aspect of the present disclosure, three sub-pixels SP1, SP2, and SP3 sequentially arranged in one direction (left and right direction) may constitute one pixel P, and the sub-pixels SP in each pixel P may be arranged in one column with a predetermined interval therebetween.

In the pixel P, the first, second, and third data lines DL1, DL2, and DL3, the power line PL, and the reference lines RL may be provided in the first direction, and the gate lines GL1, GL2, GL3, and GL4 and the EM signal lines EML1, EML2, and EML3 may be provided in the second direction which is different from (e.g., perpendicular to) the first direction. More specifically, the first, second, and third data lines DL1, DL2, and DL3 may extend in the first direction and may be disposed to correspond to the boundaries of the respective sub-pixels SP1, SP2, and SP3. The power line PL for applying the high potential power supply voltage VDD may extend in the first direction and may be provided at the boundary between the first and second sub-pixels SP1 and SP2. The reference lines RL for applying the reference voltage Vref may be disposed at the boundaries of the first and second sub-pixels SP1 and SP2 adjacent to the power line PL.

The auxiliary ground voltage line B-VL may extend or branch from the ground voltage line VL providing the low potential power supply voltage VSS and may be disposed between the data lines DL2 and DL3 of the second sub-pixel SP2 and the third sub-pixel SP3.

At this time, the first and second sub-pixels SP1 and SP2 may have planar structures symmetrical to each other with respect to the power line PL, and the second and third sub-pixels SP2 and SP3 may have planar structures symmetrical to each other with respect to the auxiliary ground voltage line B-VL.

In addition, although not shown in the figure, the third sub-pixel SP3 and the fourth sub-pixel adjacent to the third sub-pixel SP3 may have planar structures symmetrical to each other with respect to another power line PL. At this time, the third sub-pixel SP3 may have a substantially same structure as the first sub-pixel SP1, and the fourth sub-pixel may have a substantially same structure as the second sub-pixel SP2. Accordingly, two symmetrical sub-pixels may be repeatedly arranged in the second direction.

Meanwhile, two reference lines RL and the power line PL therebetween may be disposed between the first and second sub-pixels SP1 and SP2, two data lines DL2 and DL3 and the auxiliary ground voltage line B-VL therebetween may be disposed between the second and third sub-pixels SP2 and SP3, and two reference lines RL and the power line PL therebetween may be disposed between the third sub-pixel SP3 and the fourth sub-pixel. However, the present disclosure is not limited thereto.

Alternatively, two data lines DL1 and DL2 and the auxiliary ground voltage line B-VL therebetween may be disposed between the first and second sub-pixels SP1 and SP2, two reference lines RL and the power line PL therebetween may be disposed between the second and third sub-pixels SP2 and SP3, and two data lines DL3 and DL4 and the auxiliary ground voltage line B-VL therebetween may be disposed between the third sub-pixel SP3 and the fourth sub-pixel.

That is, a combination of two reference lines RL and the power line PL therebetween and a combination of two data lines and the auxiliary ground voltage line B-VL therebetween may be alternately arranged between two adjacent sub-pixels.

Further, the gate lines GL1, GL2, GL3, and GL4 extending in the second direction and crossing the first, second, and third data lines DL1, DL2, and DL3, the power line PL, and the reference lines RL may be provided at the upper and lower boundaries of the sub-pixels SP1, SP2, and SP3, and the EM signal lines EM1, EM2, and EM3 may be spaced apart from and disposed parallel to the gate lines GL1, GL2, and GL3, and GL4. Alternatively, the gate lines GL1, GL2, GL3, and GL4 may be disposed in the sub-pixels SP1, SP2, and SP3 to pass therethrough.

Here, in order for the threshold voltage sensing operation to be performed during two horizontal periods (one horizontal period is a period corresponding to twice the period in which the data voltage is supplied to the data lines DL1, DL2, and DL3), four scan signals are required, and thus four gate lines GL1, GL2, GL3, and GL4 and three EM signal lines EML1, EML2, and EML3 may be provided with one sub-pixel SP1, SP2, and SP3.

The nth emission voltage EM(n) may be applied to the first EM signal line EML1, and the first EM signal line EML1 may be connected to the fourth transistor T4. The nth scan signal SCAN(n) may be applied to the first gate line GL1 adjacent and parallel to the first EM signal line EML1, and the first gate line GL1 may be connected to the first transistor T1.

The nth emission voltage EM(n) may be applied to the second EM signal line EML2 adjacent and parallel to the first gate line GL1, and the second EM signal line EML2 may be connected to the third transistor T3. The nth scan signal SCAN(n) may be applied to the second gate line GL2 adjacent and parallel to the second EM signal line EML2, and the second gate line GL2 may be connected to the second transistor T2.

The nth scan signal SCAN(n) may be applied to the third gate line GL3, and the third gate line GL3 may be connected to the fifth and sixth transistors T5 and T6. The (n−1)th scan signal SCAN(n−1) may be applied to the fourth gate line GL4, and the fourth gate line GL4 may be connected to the eighth transistor T8.

The fourth EM signal line EML4 may be connected to the seventh transistor T7.

Here, the numbers of the power lines PL and the reference lines RL may be the same as the number of the data lines DL1, DL2, and DL3 or may be smaller than the number of the data lines DL1, DL2, and DL3. When the numbers of the power lines PL and the reference lines RL are the same as the number of the data lines DL1, DL2, and DL3, each sub-pixel SP may be connected to one power line PL and one reference line RL as well as one data line and the gate lines GL1, GL2, GL3, and GL4. However, recently, as the display device having the high resolution and large pixel integration has been developed, the restrictions of the space for the pixel arrangement further increases, and thus the power line PL and/or the reference line RL are shared by a plurality of sub-pixels SP.

This is a method of saving the space occupied by the signal lines by reducing the number of signal lines supplying a common signal to each sub-pixel SP and is a so-called flip structure in which two adjacent sub-pixels SP share the power line PL and/or the reference line RL.

Accordingly, some sub-pixels SP may be directly connected to the power line PL and the reference line RL, and other sub-pixels SP may be indirectly connected to the power line PL and the reference line RL through respective separate connection patterns (not shown). In FIG. 3, the power line PL is shared by two adjacent sub-pixels SP, and the reference lines RL are connected to the two adjacent sub-pixels SP, respectively. However, the present disclosure is not limited thereto.

In the organic light emitting display device 100 according to the first aspect of the present disclosure, the data lines DL2 and DL3 are disposed between the second sub-pixel SP2 and the third sub-pixel SP3. The ground voltage line VL supplying the low potential power supply voltage VSS, more particularly, the auxiliary ground voltage line B-VL, is further disposed between the data lines DL2 and DL3.

Through this, when a voltage difference between the adjacent data lines DL2 and DL3 occurs, the electrical interference between the data lines DL2 and DL3, that is, the coupling phenomenon may be prevented from occurring, and it is also possible to prevent a different in luminance between the neighboring sub-pixels SP from occurring.

In more detail, when the two data lines DL2 and DL3 are located adjacent to each other by using the demultiplexer, the coupling may occur between the data lines DL2 and DL3. Thus, a parasitic capacitor Cp may exist between the data lines DL2 and DL3.

Namely, when a first data voltage is applied to the second data line DL2 of the second sub-pixel SP2, the voltage is charged in a first capacitor connected to the second data line DL2, and a part of the first data voltage is also distributed to the parasitic capacitor Cp between the data lines DL2 and DL3.

As a result, the third data line DL3 of the third sub-pixel SP3 is undesirably precharged by $\Delta V$ due to the first data voltage. When a second data voltage is applied to the precharged third data line DL3, the voltage of a second capacitor connected to the third data line DL3 is further increased by $\Delta V$ through the parasitic capacitor Cp, so that the data voltage to be applied to the third sub-pixel SP3 may be changed.

Such an electrical interference phenomenon between the data lines DL2 and DL3 is referred to as a coupling phenomenon, which causes a large difference in luminance between the neighboring sub-pixels SP2 and SP3.

Accordingly, in the organic light emitting display device 100 according to the first aspect of the present disclosure, the parasitic capacitance between the data lines DL2 and DL3 may be reduced by further disposing the auxiliary ground voltage line B-VL, which is a part of the ground voltage line VL supplying the low potential power supply voltage VSS or extends or branches from the ground voltage line VL, between the data lines DL2 and DL3 adjacent to each other.

Through this, it is possible to reduce the coupling phenomenon caused by the electrical interference between the data lines DL2 and DL3.

That is, in the organic light emitting display device 100 according to the first aspect of the present disclosure, it is possible to prevent the occurrence of the electrical interference between two adjacent data lines DL2 and DL3, i.e., the coupling phenomenon while the number of the channels of the data driving portion 130 is reduced by using the demultiplexer.

Accordingly, it is also possible to prevent the large difference in luminance between the neighboring sub-pixels SP2 and SP3 from occurring.

In the above aspect, when the second data line DL2 is adjacent to the third data line DL3, that is, the distance between the first and second data lines DL1 and DL2 is greater than the distance between the second and third data lines DL2 and DL3, the auxiliary ground voltage line B-VL is disposed between the second and third data lines DL2 and DL3. Alternatively, when the second data line DL2 is adjacent to the first data line DL1, that is, the distance between the first and second data lines DL1 and DL2 is smaller than the distance between the second and third data lines DL2 and DL3, the auxiliary ground voltage line B-VL is disposed between the first and second data lines DL1 and DL2.

Further, in the organic light emitting display device 100 according to the first aspect of the present disclosure, it is also possible to prevent the low potential power supply voltage VSS from rising while the coupling phenomenon is prevented from occurring between the adjacent data lines DL2 and DL3.

That is, when the cathode of the light emitting diode Del of FIG. 1 is formed of a transparent conductive material or a metal material of a relatively very thin thickness to transmit light, the cathode has a relatively high sheet resistance, so that the cathode may not have a constant voltage value throughout the whole display panel 110.

As the display panel 110 becomes larger, this phenomenon becomes more prominent. There may occur the phenomenon that the low potential power supply voltage VSS of the cathode in the sub-pixels located far from the driving portions such as the data driving portion 130 and the power supply portion 150 rises, and according to this, the driving voltage and the power consumption increase, so that the luminance of the display device 100 becomes non-uniform.

In more detail, the ground voltage line VL is generally formed in the non-display area NEA defined along the edge of the display panel 110, and the cathode is formed of the transparent conductive material having the relatively high sheet resistance or formed in an extremely thin metal film, so that the cathode may have the relatively high resistance. Accordingly, as the organic light emitting display device 100 becomes larger, the problem occurs that the low potential power supply voltage VSS supplied to the cathode becomes non-uniform.

This problem occurs more clearly as the distance gets away far from the power supply portion 150 supplying the low potential power supply voltage VSS. The VSS rising phenomenon in which the value of the low potential power supply voltage VSS of the cathode rises is more noticeable as the sub-pixels are located further away from the power supply portion 150.

Referring to the plan view showing the planar structure of the ground voltage line VL of FIG. 4A, the data driving portion 130 may be configured in the form of integrated circuit (IC) chips at the upper end part of the display panel 110. In this case, each driving IC is mounted on a flexible circuit film 131 and is directly connected to the display panel 110.

The data driving portion 130 may include at least one driving IC. In the first aspect of the present disclosure, a case in which the data driving portion 130 is configured as a plurality of driving ICs is shown as an example. Alternatively, the driving IC may be directly mounted on the substrate of the display panel 110 as a chip on glass (COG) type.

Signal lines may be provided at the outer part of the driving IC on the flexible circuit film 131 to transfer the high potential power supply voltage VDD, the low potential power supply voltage VSS, the initialization voltage Vini, and the reference voltage Vref for driving the display panel 110 from the power supply portion 150 to the display panel 110.

In the organic light emitting display device 100 according to the first aspect of the present disclosure, the auxiliary ground voltage line B-VL is disposed between two adjacent data lines DL to prevent the coupling phenomenon between the adjacent data lines DL, so that the auxiliary ground voltage lines B-VL are also disposed in the display area AA.

Since the cathode is formed commonly to all the subpixels SP, that is, formed to cover the display area AA of the substrate as one body, when the auxiliary ground voltage line B-VL being a part of the ground voltage line VL or extending from the ground voltage line VL is also disposed in the display area AA, the contact area between the ground voltage line VL and the cathode may be increased.

Accordingly, it is possible to prevent a problem in that the low potential power supply voltage VSS supplied to the cathode becomes non-uniform, and through this, it is also possible to prevent the VSS rising phenomenon in which the value of the low potential power supply voltage VSS of the cathode rises from occurring.

Here, the auxiliary ground voltage lines B-VL are connected to outer lines VL-1 and VL-2 formed along the non-display area NEA which is defined along the peripheries of the display panel 110. The outer lines VL-1 and VL-2 include first outer lines VL-1, which are formed respectively in the upper and lower non-display areas NEA of the display panel 110, and second outer lines VL-2, which are formed respectively in the left and right non-display areas NEA of the display panel 110 and connected to the first outer lines VL-1.

At this time, to reduce the left and right non-display areas NEA of the display panel 110, even if the widths of the second outer lines VL-2 are smaller than the widths of the first outer lines VL-1, the area of the ground voltage line VL increases due to the auxiliary ground voltage line B-VL in the display area AA compared to the conventional one, so that the resistance of the ground voltage line VL decreases.

Accordingly, in the organic light emitting display device 100 according to the first aspect of the present disclosure, it is also possible to prevent the VSS rising phenomenon of the ground voltage line VL from occurring while reducing the left and right non-display areas NEA of the display panel 110.

For example, the width of the second outer line VL-2 of the ground voltage line VL may be reduced from 1500 μm to 100 μm, so that the width of the left and right non-display areas NEA of the display panel 110 may be reduced, thereby implementing a narrow bezel.

Meanwhile, by simultaneously applying the low potential power supply voltage VSS supplied by the ground voltage line VL from the upper and lower end parts of the display panel 110, the VSS rising phenomenon may be further prevented from occurring.

To do this, low potential pad electrodes (not shown) may be further provided at the upper and lower end parts of the display panel 110, respectively, so that the low potential power supply voltage VSS may be applied. The low potential pad electrodes (not shown) provided at the upper end part of the display panel 110 may be connected to the driving ICs of the data driving portion 130, and the low potential pad electrodes (not shown) provided at the lower end part of the display panel 110 may be connected to the ICs of a touch sensor driving portion 160 for driving touch sensors (not shown) provided on a screen of the display device 110.

That is, the organic light emitting display device 100 may display an image of a predetermined gray scale or receive a touch input by a finger or an active pen. The organic light emitting display device 100 may include an in-cell touch type touch layer (not shown) using a capacitive method in the display panel 110.

At this time, the lower end part of the display panel 110 may be connected to the ICs of the touch sensor driving portion 160 for driving the touch sensors of the touch layer (not shown), and the ICs of the touch sensor driving portion 160 may also be connected to the power supply portion 150, so that the low potential power supply voltage VSS may be applied from both the upper and lower end parts of the display panel 110.

Through this, it is possible to prevent the occurrence of the phenomenon in which the lower potential power supply voltage VSS becomes non-uniform as the distance from the power supply portion 150 increases.

FIG. 5A is a simulation result showing the occurrence of the phenomenon in which the low potential power supply voltage VSS becomes non-uniform when the low potential power supply voltage VSS is applied from the lower end part of the display panel. It may be seen that the VSS rising phenomenon in which the VSS voltage rises further occurs toward the upper end part of the display panel and thus the uniformity of the white luminance is measured as low as 64.2%.

In contrast, FIG. 5B is a simulation result of measuring the uniformity of the white luminance of the organic light emitting display device according to the first aspect of the present disclosure, and it may be seen that the uniformity of the white luminance is very uniformly measured as 89.2%.

That is, in the organic light emitting display device according to the first aspect of the present disclosure, the auxiliary ground voltage line B-VL being a part of the ground voltage line VL supplying the low potential power supply voltage VSS or extending from the ground voltage line VL is disposed between two adjacent data lines DL2 and DL3, thereby reducing the coupling phenomenon due to the electrical interference between the data lines DL2 and DL3. In addition, the auxiliary ground voltage line B-VL is disposed in the display area AA, and the contact area between the ground voltage line VL and the cathode increases, so that it is possible to prevent the low potential power supply voltage VSS supplied to the cathode from being non-uniform.

As described above, in the organic light emitting display device 100 according to the first aspect of the present disclosure, the number of the channels of the data driving portion 130 is reduced by using the demultiplexer, and the auxiliary ground voltage line B-VL being a part of the ground voltage line VL supplying the low potential power supply voltage VSS or extending from the ground voltage line VL is disposed between two adjacent data lines DL2 and DL3, so that the coupling phenomenon due to the electrical interference between the data lines DL2 and DL3 may be reduced.

Accordingly, it is possible to prevent the large difference in luminance between the neighboring sub-pixels SP2 and SP3 from occurring.

In addition, the auxiliary ground voltage line B-VL being a part of the ground voltage line VL or extending from the ground voltage line VL is also disposed in the display area AA, and the contact area between the ground voltage line VL and the cathode may be increased, and it is possible to prevent the occurrence of the problem in that the low potential power supply voltage VSS supplied to the cathode becomes non-uniform.

Further, the width of the second outer line VL-2 of the display panel 110 may be reduced, and the width of the left and right non-display areas NEA of the display panel 110 may also be decreased, thereby implementing the narrow bezel.

Meanwhile, the first aspect of the present disclosure has been described with the organic light emitting display device 100 as an example, but the first aspect may be applied to all the display devices having the configuration in which two data lines are adjacent to each other.

Figure 6:
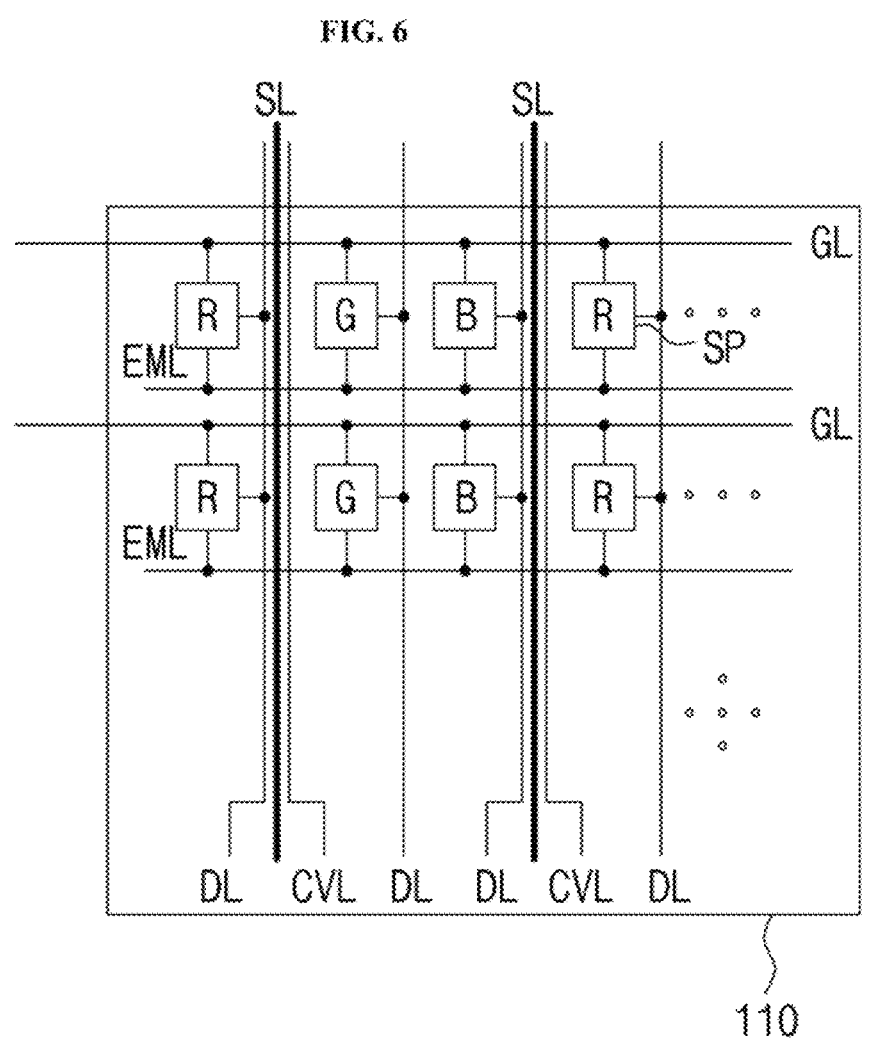

FIG. 6 is a view schematically illustrating a part of an organic light emitting display device according to a second aspect of the present disclosure.

As shown in FIG. 6, in the organic light emitting display device according to the second aspect of the present disclosure, various common voltages CV may be applied to the display panel 110 to drive the sub-pixels SP. Accordingly, common voltage lines CVL are formed in the display panel 110.

The common voltage CV may be applied to one end of a capacitor C of each sub-pixel SP through the common voltage line CVL. At this time, a unique voltage of the corresponding sub-pixel SP such as the data voltage Vdata may be applied to another end of the capacitor C of the sub-pixel SP.

Here, the common voltages CV applied to the display panel 110 may include the reference voltage Vref, the high potential power supply voltage VDD, the low potential power supply voltage VSS, and the like.

Since other voltage lines, particularly, the data lines DL, are disposed adjacent to the common voltage lines CVL supplying the common voltages CV, the coupling phenomenon may occur in the common voltages CV applied to the common voltage lines CVL.

For example, when the data voltage Vdata supplied through the data lines DL changes rapidly, that is, the data voltage Vdata changes from the high level to the low level or changes from the low level to the high level, the phenomenon may occur in which the reference voltage Vref, which is the common voltage CV supplied through the reference line of the common voltage lines CVL adjacent to the data lines DL, becomes smaller or larger than the desired voltage value at the point where the data voltage Vdata changes rapidly.

Since the coupling phenomenon of the common voltage CV makes the charging characteristics of the capacitor C to which the common voltage CV is applied non-uniform, the poor quality of the image such as the horizontal crosstalk may be caused due to the non-uniform charging characteristics.

Accordingly, in the organic light emitting display device according to the second aspect of the present disclosure, a shielding line SL may be further disposed between the common voltage line CVL and the data line DL.

The shielding line SL may be formed by branching from the initialization line supplying the initialization voltage Vini or by branching from the ground voltage line supplying the low potential power supply voltage VSS as in the first aspect of the present disclosure.

The shielding line SL is disposed on the same layer as the data line DL and/or the common voltage line CVL, so that the coupling phenomenon between the data line DL and the common voltage line CVL may be more effectively prevented.

As described above, in the organic light emitting display device according to the second aspect of the present disclosure, the shielding line SL is further disposed between the common voltage line CVL and the data line DL, so that the coupling phenomenon due to the electrical interference between the data line DL and the common voltage line CVL may be reduced.

Accordingly, it is possible to prevent the large difference in luminance between the neighboring sub-pixels SP, and it is also possible to prevent the poor quality of the image such as the horizontal crosstalk.

Meanwhile, in the case that the shielding line SL is formed by branching from the initialization line supplying the initialization voltage Vini or branching from the ground voltage line supplying the low potential power supply voltage VSS, the resistance of the initialization line or the ground voltage line may be decreased.

Particularly, when the shielding line SL is formed by branching from the ground voltage line, the width of the non-display area NEA of FIG. 4B of the display panel 110 may also be reduced, thereby implementing the narrow bezel.

As described above, according to the present disclosure, the number of channels of the data driving portion may be reduced by using the demultiplexer. In addition, the auxiliary ground voltage line being a part of the ground voltage line supplying the low potential power supply voltage, which is a direct current (DC) voltage, or extending from the ground voltage line is disposed between two adjacent data lines, and there is an effect that the coupling phenomenon due to the electrical interference between the data lines may be reduced.

Accordingly, it is possible to prevent the large difference in luminance between the neighboring sub-pixels.

In addition, the auxiliary ground voltage line is also disposed in the display area, and the contact area between the ground voltage line and the cathode may be increased, so that it is possible to prevent the occurrence of the problem in which the low potential power supply voltage supplied to the cathode becomes non-uniform.

Further, since the width of the second outer line of the display panel may be reduced, the width of the left and right non-display areas of the display panel may be creased, thereby implementing the narrow bezel.

It will be apparent to those skilled in the art that various modifications and variations may be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a display panel including a display area where a plurality of sub-pixels is located and a non-display area disposed outside the display area;

a gate driving portion including a scan driving portion and an EM driving portion, the EM driving portion disposed on at least one side of the display panel;

a first power line disposed in a first area of the non-display area and applying a power supply voltage; and a second power line disposed in a second area of the non-display area and electrically connected to the first power line, wherein the scan driving portion is disposed in the second area of the non-display area, and a width of the second area of the non-display area is less than a width of the first area of the non-display area.

2. The display device of claim 1, wherein each of the plurality of sub-pixels includes first, second, third, fourth, fifth, sixth, and seventh transistors, a storage capacitor, and a light emitting diode, and wherein the first transistor is controlled by a first scan signal, the second transistor is controlled by a voltage of a first electrode of the storage capacitor, the third transistor is controlled by an emission (EM) signal, the fourth transistor is controlled by the emission signal, the fifth transistor is controlled by a second scan signal, the sixth transistor is controlled by a third scan signal, and the seventh transistor is controlled by a fourth scan signal, the storage capacitor is electrically connected to the fourth transistor and the seventh transistor, and the light emitting diode is connected to the third transistor and the first power line.

3. The display device of claim 2, wherein the first, second, and third scan signals are same, and the fourth scan signal is different from the first, second, and third scan signals.

4. The display device of claim 2, wherein each of the plurality of sub-pixels includes further includes an eighth transistor, which is controlled by the emission signal.

5. The display device of claim 1, wherein the second power line has a different width from the first power line.

6. The display device of claim 1, further comprising a third power line disposed in the display area.

7. The display device of claim 6, wherein the third power line is electrically connected to the first power line or the second power line.

8. The display device of claim 6, wherein the first power line extends in a first direction, and the second and third power lines extend in a second direction different from the first direction.

9. The display device of claim 1, further comprising a power line disposed in the display area, wherein the plurality of sub-pixels is electrically connected to the power line through a connection pattern to share the power line.

10. The display device of claim 9, wherein the connection pattern is disposed on a different layer from the power line.

11. The display device of claim 9, wherein the connection pattern is formed of a different material from the power line.

12. The display device of claim 1, wherein each of the plurality of sub-pixels includes a light emitting element and a pixel circuit for driving the light emitting element, and wherein the pixel circuit includes a driving transistor, a first transistor controlled by a scan signal, a second transistor controlled by an emission (EM) signal, and at least one capacitor.

13. The display device of claim 12, wherein the light emitting element includes an anode, a light emitting layer, and a cathode, and the cathode is electrically connected to the first power line or the second power line.

14. The display device of claim 1, wherein a MUX driving portion is disposed between a data driving portion and the display area.

15. The display device of claim 14, wherein the MUX driving portion includes first and second MUX transistors.

16. The display device of claim 1, further comprising a data driving portion mounted on a flexible circuit film and electrically connected to the display panel.

17. The display device of claim 16, further comprising a MUX driving portion between the data driving portion and the display area, wherein at least two data lines are connected to one channel of the data driving portion through the MUX driving portion.

18. The display device of claim 17, wherein one of the at least two data lines is connected to a first MUX transistor of the MUX driving portion, and the other one among the at least two data lines is connected to a second MUX transistor of the MUX driving portion.

19. The display device of claim 1, further comprising a power supply portion electrically connected to the first power line or the second power line, wherein a distance between the EM driving portion and the power supply portion is shorter than a distance between the scan driving portion and the power supply portion.

20. The display device of claim 1, wherein the second power line is further disposed in a third area of the non-display area, and the display area is disposed between the second area and the third area of the non-display area.

21. The display device of claim 20, wherein the EM driving portion is disposed in the third area of the non-display area.

22. The display device of claim 20, wherein a length and width of the second power line are less than the length and width of the first power line.

23. A display device, comprising:

a display panel including a display area where a plurality of sub-pixels is located and a non-display area disposed outside the display area;

a gate driving portion including a scan driving portion and an EM driving portion, the EM driving portion disposed on at least one side of the display panel;

a first power line disposed in a first area of the non-display area and applying a power supply voltage;

a second power line disposed in a second area of the non-display area and electrically connected to the first power line; and a third power line disposed in the display area, wherein a width of the second area of the non-display area is less than a width of the first area of the non-display area, and wherein a width of the second power line is greater than a width of the third power line and less than a width of the first power line.

* * * * *